(12) United States Patent
Hayashi et al.

(10) Patent No.: US 6,274,512 B1
(45) Date of Patent: Aug. 14, 2001

(54) METHOD FOR MANUFACTURING A SEMICONDUCTOR DEVICE

(75) Inventors: Hisataka Hayashi, Yokohama; Tokuhisa Ohiwa, Kawasaki; Katsuya Okumura, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/658,508

(22) Filed: Sep. 8, 2000

(30) Foreign Application Priority Data

Sep. 10, 1999 (JP) .................................................. 11-257699

(51) Int. Cl.$^7$ ............................................... H01L 21/3605
(52) U.S. Cl. ............................ 438/766; 438/787; 438/788
(58) Field of Search .................................. 438/766, 787, 438/788

(56) References Cited

U.S. PATENT DOCUMENTS 4,897,154 * 1/1990 Chakravarti et al. ................ 438/476
5,762,813   6/1998 Takiyama et al. .
5,858,878   1/1999 Toda .
5,962,345 * 10/1999 Yen et al. ............................ 438/709
6,030,898 * 2/2000 Liu ....................................... 438/692

* cited by examiner

*Primary Examiner*—Vu A. Le
*Assistant Examiner*—Beth E. Owens
(74) *Attorney, Agent, or Firm*—Finnegan, Henderson, Farabow, Garrett & Dunner, L.L.P.

(57) ABSTRACT

A method comprises the steps of forming a damaged layer on a silicon substrate by subjecting the silicon substrate to a plasma treatment, forming a silicon oxide layer by exposing the surface of the damaged layer to an oxygen plasma to oxidize the surface of the silicon substrate including the damaged layer and selectively eliminating the silicon oxide layer under a condition of a high selective ratio to the silicon, in which the film thickness of the silicon oxide layer is controlled by controlling an ion energy of the oxygen plasma and exposure time of the surface of the damaged layer to the oxygen plasma in accordance with the film thickness of the damaged layer.

3 Claims, 4 Drawing Sheets

OXYGEN PLASMA

↓ ↓ ↓ ↓ ↓ ↓ ↓ ↓

FIG. 4E  HYDROFLUORIC ACID TREATMENT

METHOD FOR MANUFACTURING A SEMICONDUCTOR DEVICE

CROSS-REFERENCE TO RELATED APPLICATIONS

This application is based upon and claims the benefit of priority from the prior Japanese Patent Application No. 11-257699, filed Sep. 10, 1999, the entire contents of which are incorporated herein by reference.

BACKGROUND OF THE INVENTION

The present invention relates to a method for manufacturing a semiconductor device which eliminates a damaged layer formed on the surface of a silicon substrate by a plasma treatment.

In order to achieve a high-speed high-function semiconductor device, a growing demand has been made for the microminiaturization of individual semiconductor devices and their large-sized integration as time goes on. However, various difficulties are involved in the microminiaturization of a MOSFET constituting a major element of these semiconductor device.

For example, a problem of the so-called "short channel effect" arises due to a drop of a threshold level voltage resulting from the reduction of the channel length of the MOSFET. If a device whose threshold level voltage is different from a desired one is formed at a time of designing a semiconductor circuit, then the device operates in a way other than an intended design, thus damaging the function of an involved circuit as a whole.

Such short channel effect is due to the fact that the distortion of an electric field in the source/drain regions of the MOSFET imparts an adverse influence to a channel portion. This adverse influence can be avoided by bringing the position of a pn junction at an interface between the source/drain region and the semiconductor substrate nearer to the semiconductor surface, that is, by making the pn junction shallower.

If, however, the pn junction is made simply shallower, a resistance across the source/drain regions is increased, preventing a high-speed transmission of a signal propagating through the device. Further if a contact is provided so as to obtain electric contact on the source/drain regions, a metal material constituting that contact is diffused downwardly and punches through the junction and there is a risk that it will induce a junction leak. It may be possible to partially form an upper portion of the source/drain region with an alloy with a metal (silicide) so as to achieve a low resistance source/drain electrode. In this case, however, metal atoms are diffused into the source/drain regions and are liable to reach the junction portion.

In order to deal with such a problem, the so-called elevated source/drain structure has conventionally been proposed in which a semiconductor material is additively formed selectively on a silicon substrate surface portion corresponding to the source/drain region formation area to move the surface upwardly from the surface of the silicon substrate and, through the additively formed surface, a pn junction of the source/drain regions is formed. The elevated source/drain structure can secure the thickness of the source/drain region while achieving a shallower junction position than an original semiconductor substrate surface.

An explanation will be made below about the manufacturing steps of a MOS transistor having an elevated source/drain structure.

FIGS. 5A to 5E are cross-sectional views showing the steps of manufacturing a MOS transistor having a conventional elevated source/drain structure.

As shown in FIG. 5A, first, a gate insulating film 11 and gate electrode 12 are formed over an Si substrate 10 and then an n$^-$ diffusion layer 13 is formed. An insulating film 15 is deposited on a whole surface. Then, as shown in FIG. 5B, the insulating film 15 is subjected to RIE to form a sidewall insulating film 15. At the time of the RIE, ions or radicals are generated from gas species in the etching gas, causing them to be introduced as an impurity into an underlying Si substrate or causing a lattice defect in a substrate crystal. As a result, a defective (damaged) layer 16 is formed in the Si substrate and gate electrode surface.

A selective growth of the silicon layer is very sensitive to the surface state on which the selective growth occurs. For example, the thickness of a Si film formed varies depending upon the coarseness and crystal structure of its underlying substrate surface. There is also a possibility that the quality of the film (the presence or absence of the defect) will differ depending upon the shape of the surface. There are sometimes the cases that, by the native oxide film on the substrate surface immediately prior to the growth or a damage, etc., produced at the time of forming a gate electrode, for example, the thickness of the silicon layer formed as a film on the source/drain region and its film quality differ from element to element.

If the thickness of the selectively grown silicon layer is not uniform, it becomes very difficult to form a pn junction area at a predetermined position. Since an impurity with which the source/drain region is to be formed is introduced from the selectively formed silicon layer surface, this junction is formed at a predetermined position from that surface. If, on the other hand, the film thickness is not uniform, then a relative position of an additively formed silicon surface relative to the surface of the silicon substrate becomes indefinite and hence the position of the junction surface to be formed also becomes indefinite.

For this reason, prior to the selective growth of the silicon, it is necessary to remove the damaged layer.

Then, as shown in FIG. 5C, the damaged layer 16 is removed. In order to remove the damaged layer 16, use is made of a wet treatment using chemicals, such as a hydrofluoric acid/nitric acid-mixed solution or a CDE method using lower kinetic energy radicals generated in a $CF_4$ or $Cl_2$ gas plasma and, by doing this, the Si substrate is isotropically etched to remove any damage involved.

Then, as shown in FIG. 5D, silicon 18, 19 is selectively grown. It is to be noted that, on the silicon substrate, an epitaxial growth is produced to provide a single crystalline silicon 18. And an n-type impurity ion is implanted and annealing is performed to form source/drain regions 20.

And, as shown in FIG. 5E, after the deposition of Co, annealing is performed to form Co silicide 22 and unreacted Co is eliminated to form a MOS transistor having an elevated source/drain structure.

Although the removal of the damaged layer is carried out by etching the silicon substrate, the etching amount of the silicon substrate greatly depends upon a damaged amount of the damaged layer and exposed amount of the silicon substrate surface and, since an unstable process is involved, it is difficult to control the etching amount. If any reliable product tries to be produced, then it is necessary to etch the silicon substrate considerably excessively.

On the other hand, there has been a tendency that, due to the miniaturization of the semiconductor device, the diffusion layer formed in the silicon substrate surface portion becomes shallower in depth. If, therefore, the damaged layer is removed by the above-mentioned procedure, it follows that not only the damaged layer but also the non-defective silicon substrate is deeply eliminated. As a result, the diffused layer becomes shallower in depth and an electric defect occurs, thus presenting a problem.

BRIEF SUMMARY OF THE INVENTION

It is accordingly the object of the present invention to provide a method for manufacturing a semiconductor device which eliminates a damaged layer under better control and suppresses the generation of an electric defect.

In order to achieve the above-mentioned object of the present invention, the present invention has been achieved as will be set out below.

(a) A manufacturing method of a semiconductor device according to the present invention comprises the steps of forming a damaged layer on a surface of a silicon substrate by subjecting the silicon substrate to a plasma treatment, forming a silicon oxide layer by exposing the surface of the damaged layer to an oxygen plasma to oxidize a surface of the silicon substrate including the damaged layer and selectively eliminating the silicon oxide layer under a condition of a higher selective ratio to the silicon, wherein the film thickness of the silicon oxide layer to be formed is controlled by controlling an ion energy of the oxygen plasma and exposure time of the damaged layer surface to the oxygen plasma in accordance with the film thickness of the damaged layer.

A preferred embodiment of the present invention will be described below.

The selective elimination of the silicon oxide layer is effected by a solution or vapor including a hydrofluoric acid.

(b) A manufacturing method of a semiconductor device according to the present invention comprises the steps of forming a gate insulating film and gate electrode over a silicon substrate, depositing an insulating film on the surfaces of the silicon substrate and gate electrode, forming a sidewall insulating film, and forming a damaged layer on the surface of the silicon substrate, by subjecting the insulating film to RIE to eliminate the insulating film on the upper surface of the silicon substrate while leaving the insulating film on a side face of the gate electrode, forming a silicon oxide film by exposing the surface of the damaged layer to an oxygen gas plasma to oxidize the surface of the silicon substrate including the damaged layer, and selectively eliminating the silicon oxide layer.

The present invention has a function and advantage by the above-mentioned structure as will be set out below.

After the oxide film has been formed in accordance with the film thickness of the damaged layer, a damaged layer is eliminated under better control by eliminating the oxide film selectively and it is possible to prevent the generation of an electric defect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A to 4E are cross-sectional views showing the step of eliminating a damaged layer after a chemical mechanical polishing step is done according to a second embodiment.

DETAILED DESCRIPTION OF THE INVENTION

The embodiments of the present invention will be explained below with reference to the accompanying drawings.

First Embodiment

FIGS. 1A to 1F are cross-sectional views showing a structure of a semiconductor device according to a first embodiment of the present invention.

Figure 1A:
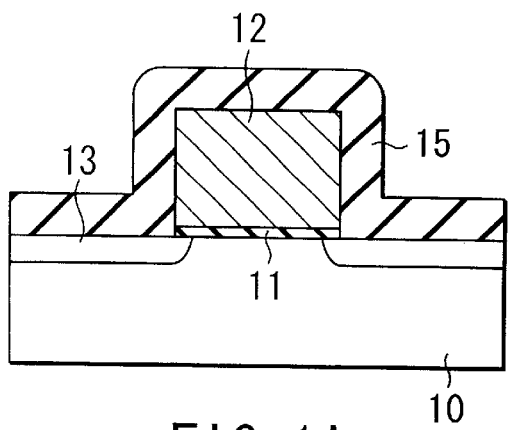
FIGS. 1A to 1F are cross-sectional views showing the manufacturing steps of a MOS transistor having an elevated source drain structure according to a first embodiment.

First, as shown in FIG. 1A, a gate insulating film 11 is formed on a silicon substrate 10 and, after the deposition of a polysilicon film and patterning, a gate electrode 12 is formed. After a thermal oxidation film, not shown, has been formed on the surface of the gate electrode 12, the ion implantation of the silicon substrate 10 and RTA for activation are done to provide an n$^-$ diffusion layer 13. An insulating film 15, such as a silicon nitride film, of 30 to 50 nm is deposited on a whole surface.

Figure 1D:
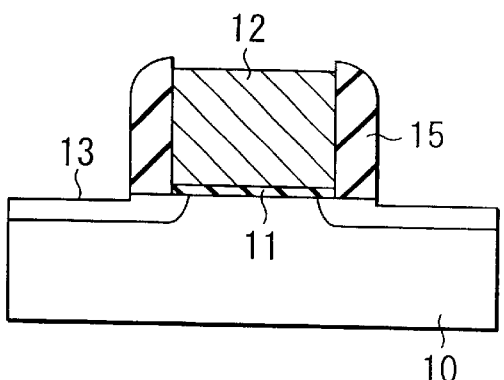
Figure 1B:
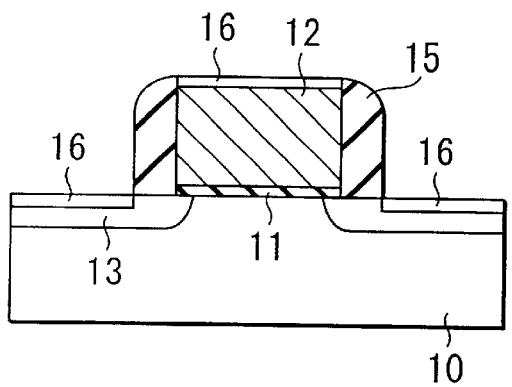

Then, as shown in FIG. 1B, the insulating film 15 is subjected to RIE to provide a sidewall insulating film 15 on the sidewall of the gate electrode 12. In the RIE process, a damaged layer 16 is formed on the surfaces of the gate electrode 12 and n$^-$ diffusion layer 13.

Then, within a parallel flat plate type RIE apparatus, the silicon substrate 10 is placed on a cathode side and the damaged layer 16 is placed opposite to an anode side. As shown in FIG. 1C, an oxygen plasma is generated within the parallel flat plate type RIE apparatus to cause the damaged layer 16 to be exposed to the oxygen plasma to provide an oxide layer 17. At this time, the energy of the oxygen ions incident on the damaged layer 16 and exposure time of the damaged layer to the oxygen plasma are controlled, thus controlling the film thickness of the oxide layer 17.

Figure 2:
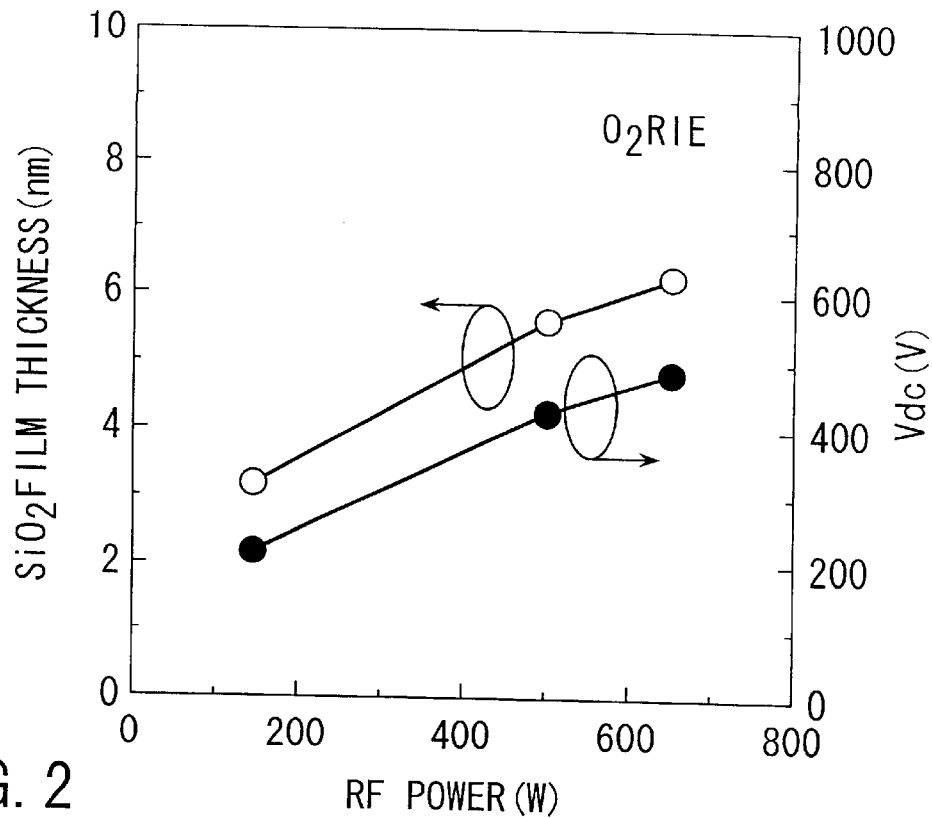
FIG. 2 is a characteristic diagram showing a relation of an oxide film thickness and cathode drop voltage incident on the silicon surface to an RF power.
Figure 3:
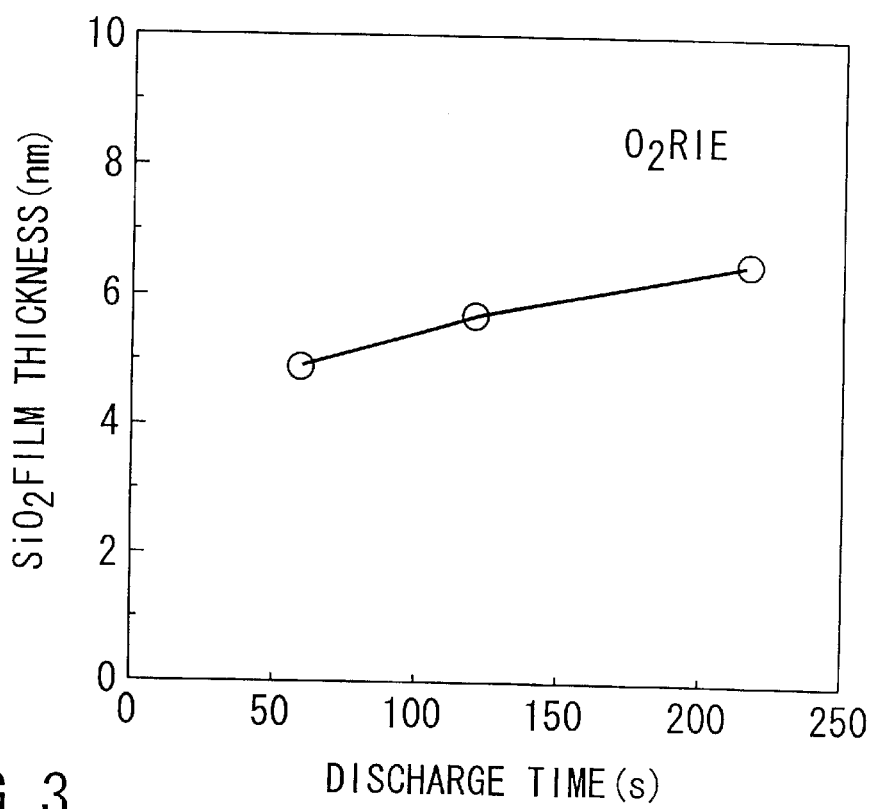
FIG. 3 is a characteristic diagram showing an oxide film thickness to an $O_2$ RIE treatment time (discharge time)

An explanation will be made below about controlling the thickness of the oxide layer 17. FIG. 2 is a characteristic diagram showing a relation of an oxide film thickness and cathode drop voltage Vdc incident on the silicon surface relative to an RF power applied to the parallel flat plate type RIE apparatus.

As shown in FIG. 2, with a rise in the RF power, the cathode drop voltage rises. With the rise of the cathode drop voltage, the energy of the oxygen ion incident on the cathode side also rises. The thickness of the oxide film formed in accordance with the energy of the oxygen ions is also increased.

Even if the RF power varies on the order of 100W, the thickness variation of the oxide film is about 1 nm at max. The variation of the thickness of the oxide film with respect to the variation of the RF power is gradual and it is possible to effect the thickness control of the oxide film with an accuracy as high as the nm order.

In the present embodiment, the oxygen plasma condition was so set as to set the energy of the oxygen ion incident on the silicon substrate to above 100 eV and the thickness of the formed oxide film to below 10 nm.

It is found that, as indicated by the thickness of the oxide film with respect to the $O_2$ RIE treatment time (discharge time), the thickness of the oxide film is increased as the treatment time becomes longer.

From the above it is found that, by controlling the RF power and treatment time, the thickness of the oxide film can be controlled on the order of nm order.

Then, as shown in FIG. 1D, the oxide film 17 is exposed to a hydrofluoric acid solution or hydrofluoric acid vapor to selectively remove the oxide layer 17. Since the etching rate of the silicon with respect to the $SiO_2$ is above 100, the etching of the silicon substrate during the removal of the oxide film can be ignored.

An oxide film is formed vertical to the surface of the silicon substrate and the silicon substrate 10 is anisotropically etched.

It is to be noted that the sidewall insulating film 15 is preferably formed of a material, such as silicon nitride, less etched by the hydrofloric acid solution or hydrofluoric vapor. Even if the sidewall insulating film is formed of a material etched by the hydrofluoric acid solution or vapor, since the film thickness of the oxide film is of the order of 10 nm, the amount of the sidewall insulating film etched by the hydrofluoric acid solution or vapor is also of the order of 10 nm, a range which can be ignored.

Figure 1E:
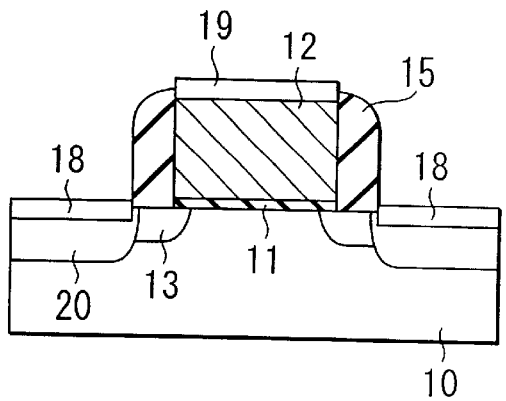
Figure 1C:
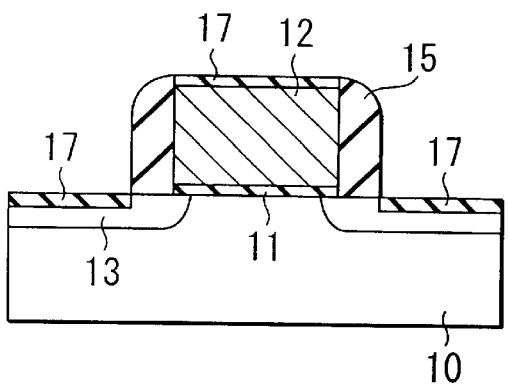

Then, as shown in FIG. 1E, after a predetermined is performed at 800° C., for three minutes, in a hydrogen atmosphere of a 10 Torr pressure, silicon 18, 19 is deposited on the surfaces of the gate electrode and silicon substrate by a selective vapor-phase growth using $SiH_2Cl_2+HCl+H_2$. It is to be noted that an epitaxial growth is produced on the surface of the silicon substrate 10 and a single crystalline silicon 18 is formed on the silicon substrate 10. And the ion implantation of an n-type impurity and annealing are performed to form $n^+$ source/drain regions 20.

Figure 1F:
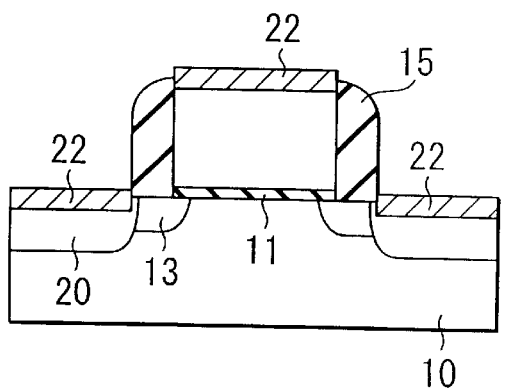

Then, as shown in FIG. 1F, Co is deposited by a sputtering method and heating is performed to form a Co silicide 22. And any unreacted Co is selectively eliminated.

By the manufacturing steps above, a MOS transistor is formed with elevated source/drain regions.

According to the present embodiment, it was possible to lower a digging amount of the silicon substrate to below 5 nm by controlling the thickness of the oxide film formed by controlling the RF power and $O_2$ plasma treatment time in accordance with the thickness of the damaged layer and to obtain a better electric characteristic even in an element having a diffusion layer depth of 100 nm.

It is also possible to apply this to an ordinary MOS transistor, not one having the elevated source/drain regions. For the ordinary MOS, it is only necessary to, after the removal of the oxide film, ion-implant an n type impurity and perform an annealing step to form $n^+$ source/drain regions.

Second Embodiment

According to the present embodiment, an explanation will be made below about an example in which the removal of the damaged layer is applied to the post-treatment of a chemical mechanical polishing (CMP) method.

FIGS. 4A to 4E are cross-sectional views showing the steps of manufacturing a semiconductor substrate according to a second embodiment of the present invention.

Figure 4A:
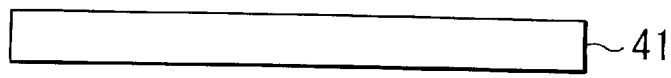
Figure 4B:
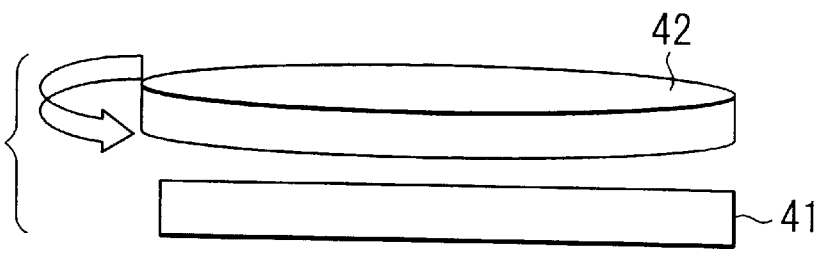
Figure 4C:
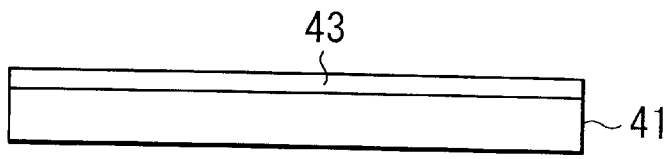

First, a silicon substrate 41 as shown in FIG. 4A is prepared. Then, as shown in FIG. 4B, the surface of the silicon substrate 41 is polished, by a chemical mechanical polishing method, with the use of a polishing cloth 42. By the polishing treatment, as shown in FIG. 4C, a damaged layer 43, such as a crystal defect, is formed on the surface of the silicon substrate. The density of the stacking fault induced on the silicon substrate surface was measured by an oxidation-induced stacking fault (OSF) checking method and 800 pieces/$cm^2$ was found as the defects.

Figure 4D:
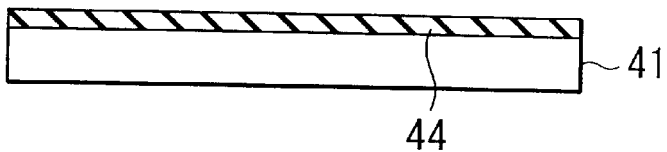
Figure 4D:
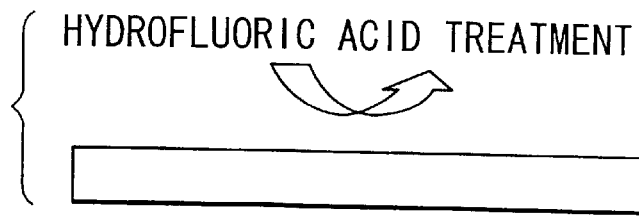
Figure 5A:
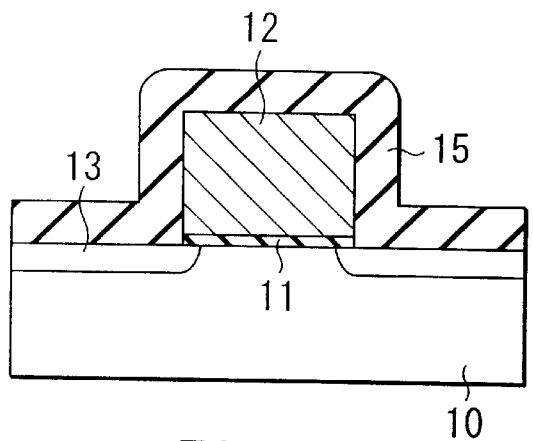
FIGS. 5A to 5E are cross-sectional views showing the manufacturing steps of a MOS transistor having a conventional elevated source/drain structure.
Figure 5D:
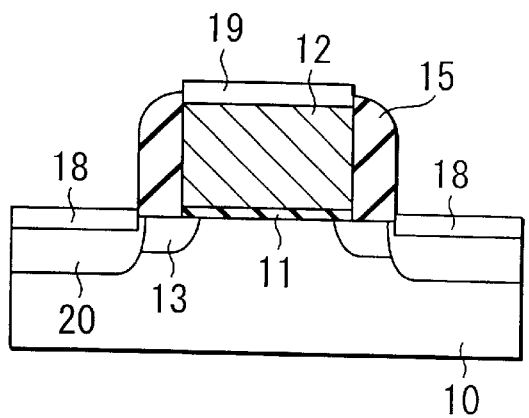
Figure 5B:
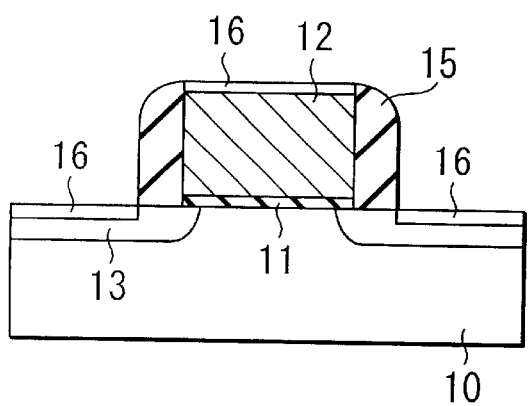
Figure 5E:
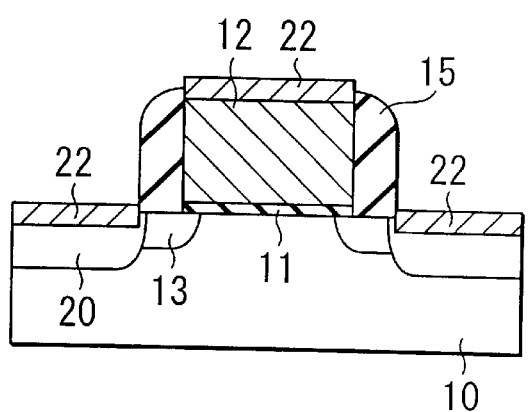
Figure 5C:
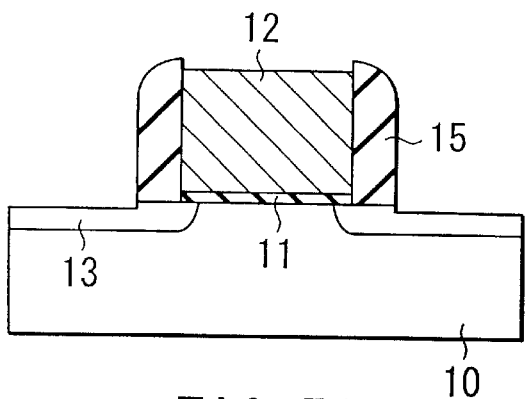

Then, as shown in FIG. 4D, the silicon substrate is placed on a cathode side of a parallel flat plate type RIE layer and an oxygen plasma is generated to cause the damaged layer 43 on the surface of an exposed silicon substrate 41 to be exposed to the oxygen plasma. By this plasma treatment, the damaged layer 43 on the surface of the silicon substrate 41 is oxidized to form an oxide film layer 44. It is to be noted that, in accordance with the thickness of the damaged layer, the plasma treatment condition of the RF power and treatment time is controlled to control the thickness of the oxide film layer 44.

Then, as shown in FIG. 4E, the oxide film layer 44 is selectively removed by a hydrofluoric acid solution or vapor. As set out in connection with the previous embodiment, since the etching rate of the silicon to the $SiO_2$ is above 100, the etching amount of the silicon substrate during the removal of the oxide film layer 44 can be ignored.

Again, when the density of the OFS on the silicon substrate surface by the OFS checking method was measured, then 60 pieces/$cm^2$ was only noted. This value is substantially the same as the defect density prior to the polishing treatment and it has been found that the damaged layer induced by the polishing treatment is better removed by the damage removal processing.

The present invention is not restricted to the above-mentioned embodiments and various changes or modifications of the present invention can be made without departing from the spirit and scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device, comprising the steps of:

forming a damaged layer on a surface of a silicon substrate by subjecting the silicon substrate to a plasma treatment;

forming a silicon oxide layer by exposing the surface of the damaged layer to an oxygen plasma to oxidize the surface of the silicon substrate including the damaged layer; and selectively eliminating the silicon oxide layer under a condition of a higher selective ratio to the silicon, wherein the film thickness of the silicon oxide layer is controlled by controlling an ion energy of the oxygen plasma and exposure time of the damaged layer surface to the oxygen plasma in accordance with the film thickness of the damaged layer.

2. A method according to claim 1, wherein the selective elimination of the silicon oxide layer is effected by a solution or vapor including a hydrofluoric acid.

3. A method for manufacturing a semiconductor device comprising the steps of:

forming a gate insulating film and gate electrode over a silicon substrate;

depositing an insulating film on the surfaces of the silicon substrate and gate electrode;

forming a sidewall insulating film, and forming a damaged layer on the surface of the silicon substrate, by subjecting the insulating film to RIE to eliminate the insulating film on the upper surface of the silicon substrate while leaving the insulating film on a side face of the gate electrode;

forming a silicon oxide layer by exposing the surface of the damaged layer to an oxygen gas plasma to oxidize the surface of the silicon substrate including the damaged layer; and selectively eliminating the silicon oxide layer.

* * * * *